United States Patent [19]

Comiskey et al.

[11] 4,019,127
[45] Apr. 19, 1977

[54] ANALOG OSCILLOSCOPE

[75] Inventors: Gary F. Comiskey, Evanston; Gregory N. Hesse, Lombard, both of Ill.; Johannes Peter Bovenlander, Kormmenie, Netherlands

[73] Assignee: Sun Electric Corporation, Chicago, Ill.

[22] Filed: Dec. 12, 1975

[21] Appl. No.: 640,220

[52] U.S. Cl. .............................................. 324/16 S
[51] Int. Cl.² ...................................... F02P 17/00
[58] Field of Search ............................. 324/165, 15

[56] References Cited

UNITED STATES PATENTS

| 3,404,333 | 10/1968 | Roberts | 324/16 S |
|---|---|---|---|
| 3,409,824 | 11/1968 | Makuh | 324/16 S |
| 3,573,608 | 4/1971 | Marino et al. | 324/16 S |
| 3,788,129 | 1/1974 | Trussell | 324/15 X |

OTHER PUBLICATIONS

B 495,331, Mar. 1976, Johnston et al., 324/16 S X.

*Primary Examiner*—Stanley T. Krawczewicz
*Attorney, Agent, or Firm*—Allegretti, Newitt, Witcoff & McAndrews

[57] ABSTRACT

Various improvements in an analog oscilloscope for an automotive ignition analyzer are disclosed, including, among others, a short store circuit which enables the full amplitude of the firing line voltage to be displayed and a sweep trigger circuit which correlates engine speed and sweep length.

14 Claims, 9 Drawing Figures

ANALOG OSCILLOSCOPE

BACKGROUND OF THE INVENTION

The present invention relates generally to an analog oscilloscope and more particularly to an analog oscilloscope for use in conjunction with an automotive ignition analyzer.

Ignition analyzers having oscillographic display capabilities are well known. During engine analysis, the primary and secondary coil waveforms are generally displayed.

In recent years, ignition analyzers have become particularly sophisticated, utilizing advanced analog, digital and conversion technologies. This sophistication stems directly from the need for a more detailed and precise examination of the ignition waveforms. As such, compatible display equipment is required.

SUMMARY OF THE INVENTION

Principally, the present invention includes improvements on known oscillographic display devices for ignition analyzers, which result in a more detailed and accurate display of the ignition waveforms.

In a first aspect, the present invention includes a short store circuit, providing display of substantially the full amplitude of the firing line voltage, i.e., the peak of the secondary coil waveform. The short store circuit primarily includes amplifier means, voltage storage means, controllably conductive discharge means and control means. The amplifier means charges the voltage storage means in response to the secondary coil signal. The voltage storage means is controllably discharged, such that the peak amplitude is stored on the voltage storage means for a period of time sufficient to provide full display.

In another aspect, the present invention includes a sweep trigger circuit for correlation of engine speed and sweep rate or length. The sweep trigger circuit primarily includes integrator means, first voltage storage means, switch means and reciprocal means. The integrator means provides a series of ramp signals in response to a single ignition source, e.g., the secondary coil voltage from a single cylinder. The frequency and final amplitude of the ramp signals or voltages depends upon engine speed (RPM). The ramp signals are sampled under operation of the switch means, and the first voltage storage means is responsively charged to a sample sweep voltage substantially inversely proportional to engine speed. The reciprocal means provides an output or RPM voltage substantially proportional to engine speed.

In yet another aspect, the present invention includes a loupe circuit for use in an ignition analyzer having superimposed display and cylinder select capabilities. The loupe circuit includes means for generating a selected cylinder pulse, reset pulse and transfer pulse, first and second latch means, voltage transfer means and gate means. The gate means responds to the voltage storage means and second latch means to blank the unselected cylinder waveforms. The first latch means provides an input voltage to the voltage transfer means. The referenced pulses are sequenced such that all cylinder waveforms are displayed, should no specific cylinder be selected.

It is thus an object of the present invention to provide an improved oscillographic display device.

It is also an object of the present invention to provide an oscilloscope having a voltage storage capability whereby the amplitude of a rapid voltage peak is stored for accurate display.

It is another object of the present invention to provide a voltage storage circuit for an analog oscilloscope used in conjunction with an ignition analyzer, whereby the firing line voltage is accurately displayed.

It is yet another object of the present invention to provide an oscillographic display device for an ignition analyzer, wherein sweep length is accurately correlated to engine speed.

It is also an object of the present invention to provide a sweep trigger circuit for correlation of engine speed and sweep length, which is responsive to rapid changes in engine speed.

It is a further object of the present invention to provide a loupe circuit for an ignition analyzer having superimposed display capability, whereby at least one ignition waveform can be selected and displayed.

Another object of the present invention is to provide a means of adjusting the point at which the display of an engine ignition signal is commenced on a display face.

These and other objects, features and advantages of the present invention are apparent from the following detailed description.

BRIEF DESCRIPTION OF THE DRAWING

A preferred embodiment of the present invention is described, in detail, herein with reference to the drawing wherein.

DESCRIPTION OF THE PRIOR ART AND THE PREFERRED EMBODIMENT

Figure 1:
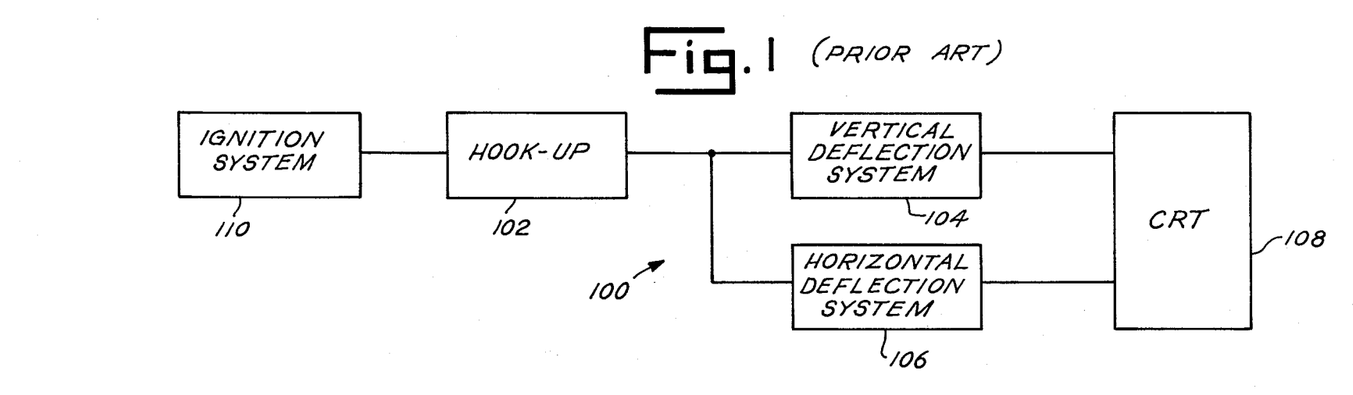
FIG. 1 is a schematic diagram of a known oscillographic display device.

An analog oscillographic display device 100 is schematically shown and labeled "PRIOR ART" in FIG. 1. The oscilloscope 100 includes a hook-up 102, vertical deflection system 104, horizontal deflection system 106 and cathode ray tube 108. The hook-up 102 provides an electro-magnetic coupling to an automotive ignition system 110.

The oscilloscope 100 has three display capabilities; parade, raster and superimposed. In the parade mode, the cylinder ignition waveforms, e.g., the secondary coil voltages, are displayed along the zero line in sequence beginning with the first cylinder. In raster, the individual cylinder waveforms are displayed over the full horizontal scale. The first cylinder waveform is located on the zero line and the following cylinders are displayed vertically at substantially equal intervals. In the superimposed mode, the waveforms are superimposed on the zero line. As in raster, the waveforms are displayed over the full horizontal scale. An oscilloscope capable of presenting waveforms in the parade, raster and superimposed modes is shown in U.S. Pat. No. 3,573,608 (Marino et al. —1971).

The operational mode of the oscilloscope 100 is selectively chosen by means of a function selector.

The oscilloscope 100 also includes means for generating a retrace blanking pulse and blanking means responsive to the blanking pulse. The blanking means is included in the cathode ray tube 108. A blanking pulse is issued after each complete horizontal trace.

The oscilloscope 100 also includes a displacement feature, available in the parade mode of operation. This feature enables one cylinder waveform to be selected and isolated for analysis. The selected cylinder waveform is shifted upwards from the zero line and extended to full horizontal scale. Selection can be achieved by a series of switches.

The switches operate in conjunction with a cylinder counter and a pulse generator to provide a selected cylinder pulse. The ignition waveform corresponding to the selected cylinder is displaced from the parade.

Figure 2:
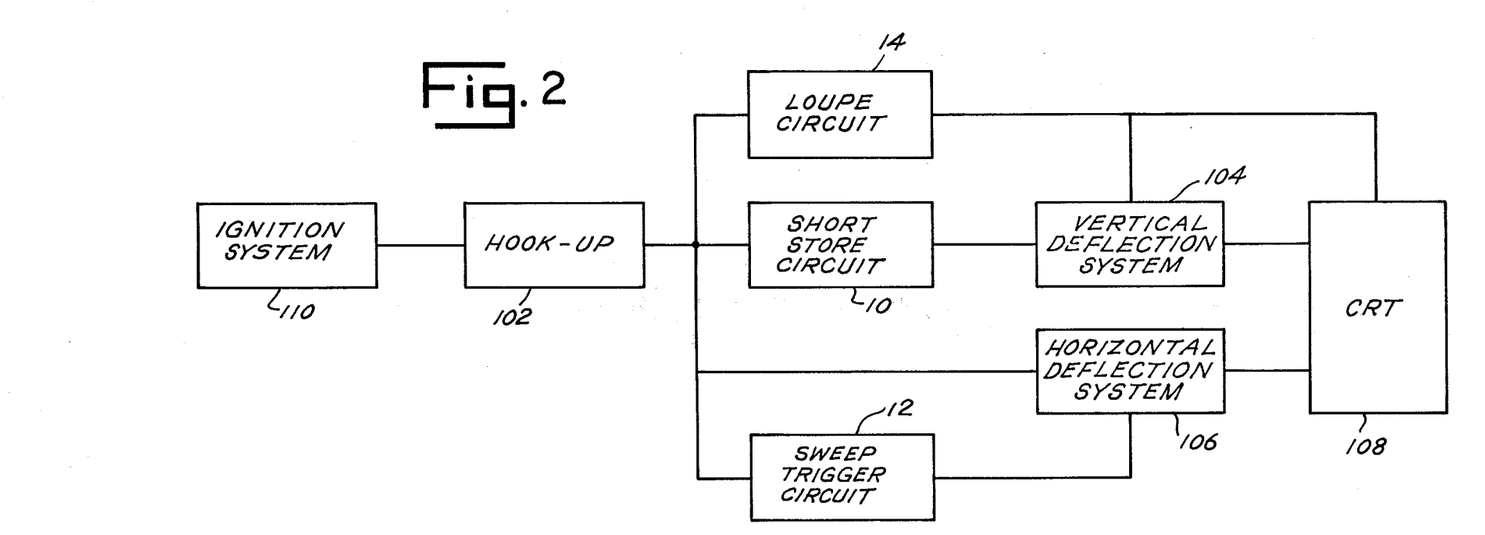
FIG. 2 is a schematic diagram of an oscillographic display device including a preferred embodiment of the present invention.

The present invention represents a series of improvements on the basic oscilloscope 100. Referring to FIG. 2, the improvements generally include a short store circuit 10, a trigger sweep circuit 12 and a loupe circuit 14, incorporated as shown. A novel sweep and advanced trigger circuit is also shown in connection with FIG. 4A.

Figure 3:
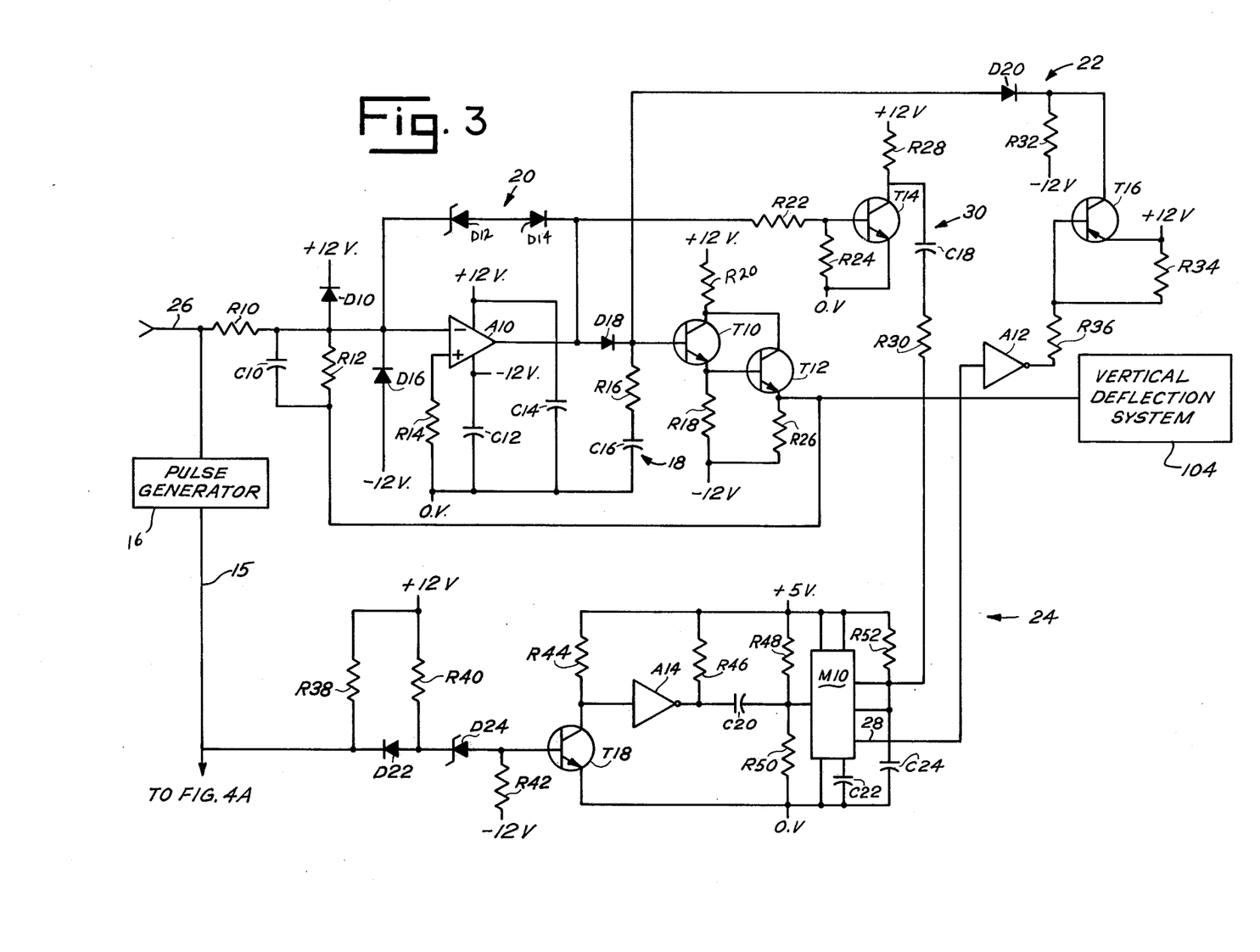
FIG. 3 is an electrical schematic diagram of the short store circuit shown in FIG. 2.

The short store circuit 10 is shown, in detail, in FIG. 3. The short store circuit 10 provides accurate display of the secondary coil waveform peak, i.e., the firing line voltages.

As shown, the short store circuit includes a timing pulse generator 16, voltage storage means 18, amplifier means 20 for charging the voltage storage means 18 in the response to the secondary coil voltage signal, controllably conductive means 22 for discharging the voltage storage means 18 and control means 24. More particularly, the short store circuit 10 includes resistors R10–R52, capacitors C10–C24, diodes D10–D24, transistors T10–T18, amplifiers A10–A14 and a monostable multivibrator M10, interconnected as shown.

Through the input 26 of the short store circuit 10, the amplifier means 20 receives the secondary coil voltage signal and produces a charging voltage in response thereto. A negative secondary signal at the input 26 causes the amplifier means 20 to charge the voltage storage means 18, i.e., capacitor C16, to a positive level through the diode D18 and resistor R16. The voltage storage means 18 is charged until the voltage on the emitter of the transistor T12 substantially equals the negative peak of the secondary signal. As the secondary coil signal begins to increase from the negative peak, the diode D18 becomes reverse biased.

As the voltage storage means 18 charges, the control means 24 maintains the controllably conductive means 22, including the diode D20 and resistor R32, in an inoperative state. On a conductor 15, in response to the secondary signal from each cylinder, the pulse generator 16 produces a CYL CLOCK pulse, shown in FIG. 6, which triggers the monostable M10. The CYCL CLOCK pulse goes low as the points (not shown) of the ignition system 110 open and high again as the points close. The output 28 of the monostable M10 therefore goes high with initiation of the CYL CLOCK pulse and the transistor T16 conducts, such that the diode D20 is reverse biased.

The amplifier means 20 is also connected to the control means 24 through switch means 30. When the output of the amplifier means 20 becomes negative, the control means 24 places the controllably conductive means 22 in an operative discharging state, whereby the voltage storage means 18 is discharged through the resistor R32. That is, in response to the polarity change in the charging voltage of the amplifier means 20, the transistor T14 of the switch means 32 becomes nonconductive, and after a time delay determined by the resistor R30 and capacitors C18, C24, the output of the monostable M10 goes low. The diode D20 then conducts.

As such, the peak amplitude of the secondary coil signal is stored on the voltage storage means 18 and available for display on the cathode ray tube 108. As shown, the voltage storage means 18 is connected to the vertical deflection system 104 of the oscilloscope 100. The transistors T10, T12 are a high impedance buffer for the stored charge or voltage.

Figure 4:
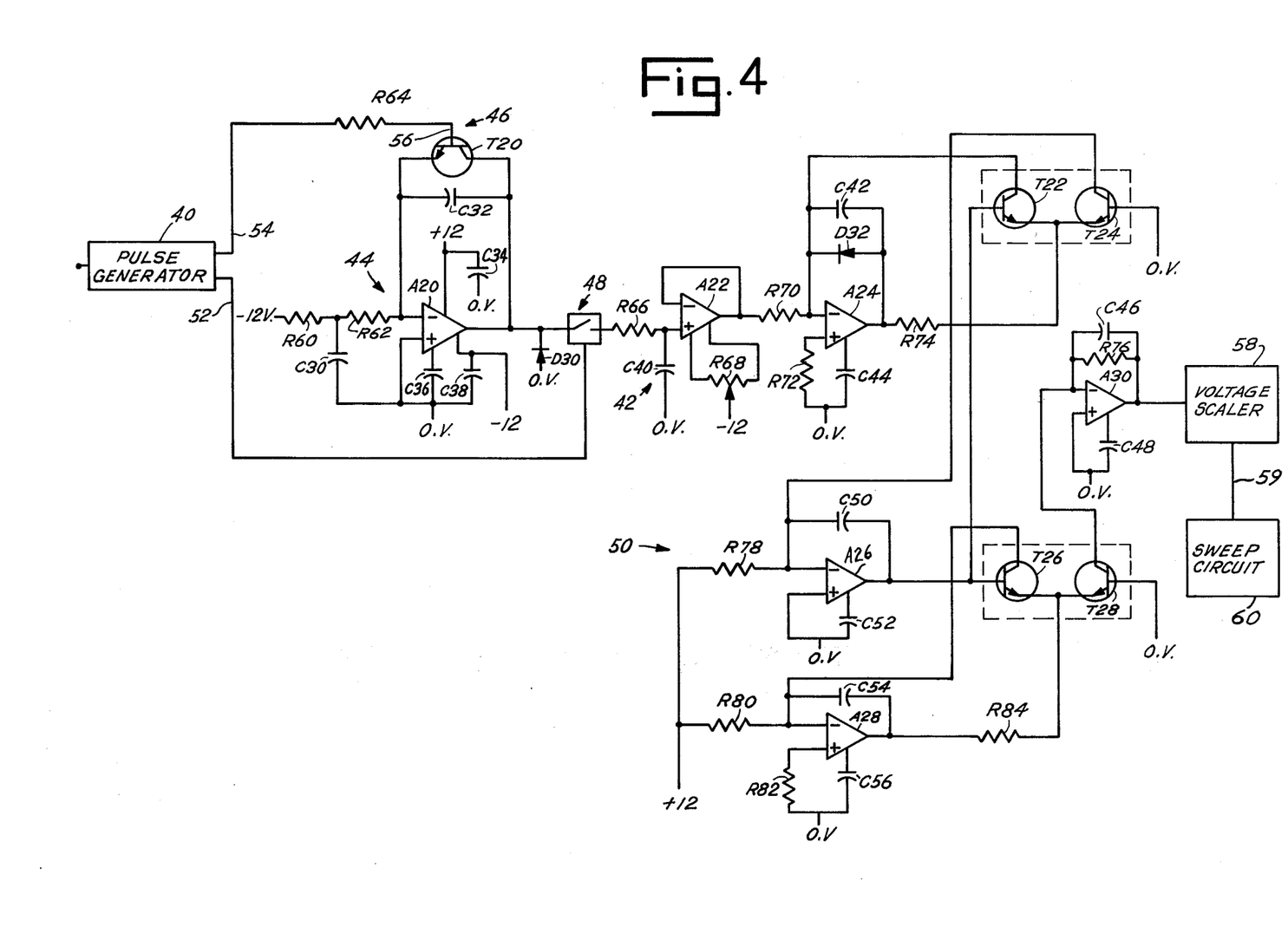
FIG. 4 is an electrical schematic diagram of the sweep trigger circuit shown in FIG. 2.

The sweep trigger circuit 12 is shown, in detail, in FIG. 4. The trigger circuit 12 produces an RPM voltage utilized in the horizontal deflection system 106 to correlate sweep speed or length with engine speed. The trigger circuit 12 provides substantial stability and recovery capability under rapid engine speed changes.

The sweep trigger circuit 12 includes pulse generating means 40, first voltage storage means 42, integrator means 44, first controllably conductive means 46 for discharging the integrator means 44, switch means 48 interposed the first voltage storage means 42 and integrator means 44 and reciprocal means 50. More particularly, the trigger circuit 12 includes resistors R60–R84, capacitors C30–C56, diodes D30–D32, transistors T20–T28 and amplifiers A20–A30, interconnected as shown.

Figure 6:
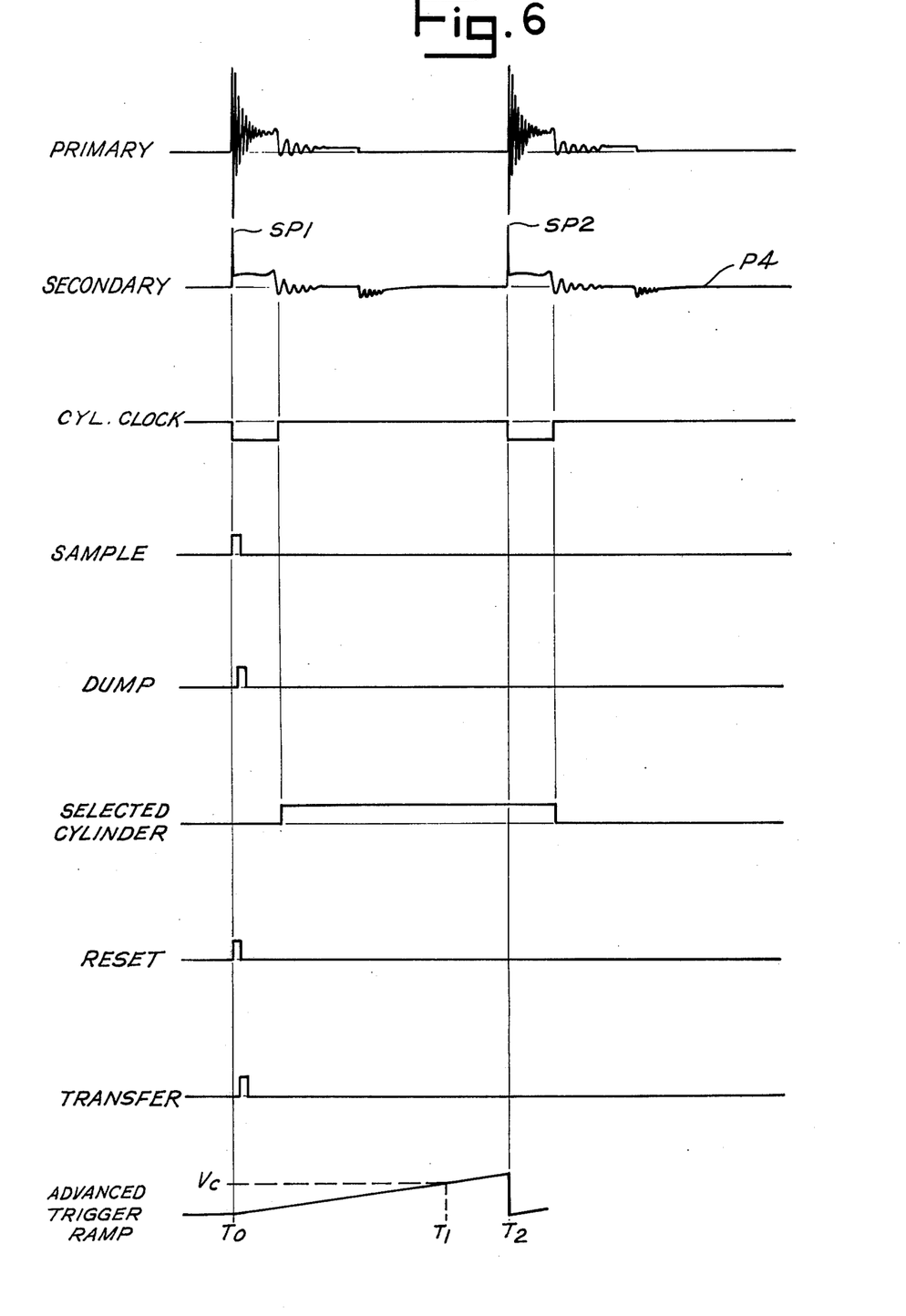
FIG. 6 illustrates ignition waveforms and various pulses produced and utilized in the circuits shown in FIGS. 3, 4 and 5.

In response to a single ignition signal, e.g., the first cylinder secondary coil voltage, the pulse generating means 40 produces a SAMPLE pulse at a first output 52 and a DUMP pulse at a second output 54. The SAMPLE and DUMP pulses are shown in FIG. 6 for the first cylinder secondary coil signal. Preferably, the input of genertor means 40 is connected to the spark plug lead for the number one cylinder of the engine being tested. Such an arrangement is shown in U.S. Pat. No. 3,788,129 (Trussell—Jan. 29, 1974).

The DUMP pulse sequentially follows the SAMPLE pulse. Each pulse is approximately twenty (20) mircoseconds in length. The length of the SAMPLE pulse is correlated to circuit parameters.

The integrator means 44 produces a series of ramp voltage signals under the control of the pulse generating means 40 or, more particularly, the DUMP pulse produced thereby. In response to a DUMP pulse, the first controllably conductive means 46, i.e., transistor T20, conducts and discharges the capacitor C32, discontinuing the ramp signal. As shown, the control terminal 56 of the transistor T20 receives the DUMP pulse.

The output of the integrator means 44 is sampled and stored on the first voltage storage means 42, i.e., capacitor C40, at a rate derived from the engine speed. As shown, the sampling is controlled by the switch means 48 which conducts in response to a SAMPLE pulse from the pulse generating means 40. The amplitude of the ramp voltage achieved during the sample and the frequency of sampling vary with engine speed. As such, the voltage developed on the first voltage storage means 42, or the sample sweep voltage, is substantially inversely proportional to engine speed.

A high input impedance amplifier A22 interconnects the first voltage storage means 42 and reciprocal means 50. The RPM output voltage of the reciprocal means 50 is inversely proportional to the sample sweep voltage. Thus, an increase in engine speed provides a larger RPM voltage to the horizontal deflection system 106 of the analog oscilloscope 100, thereby maintaining correlation between engine speed and sweep length.

As shown, the output of the sweep trigger circuit 12 is connected through a voltage scaler 58 to the individual sweep circuit 60 of the horizontal deflection system 106. In the scaler 58, the RPM voltage is scaled in accordance with the number of engine cylinders.

Figure 4A:
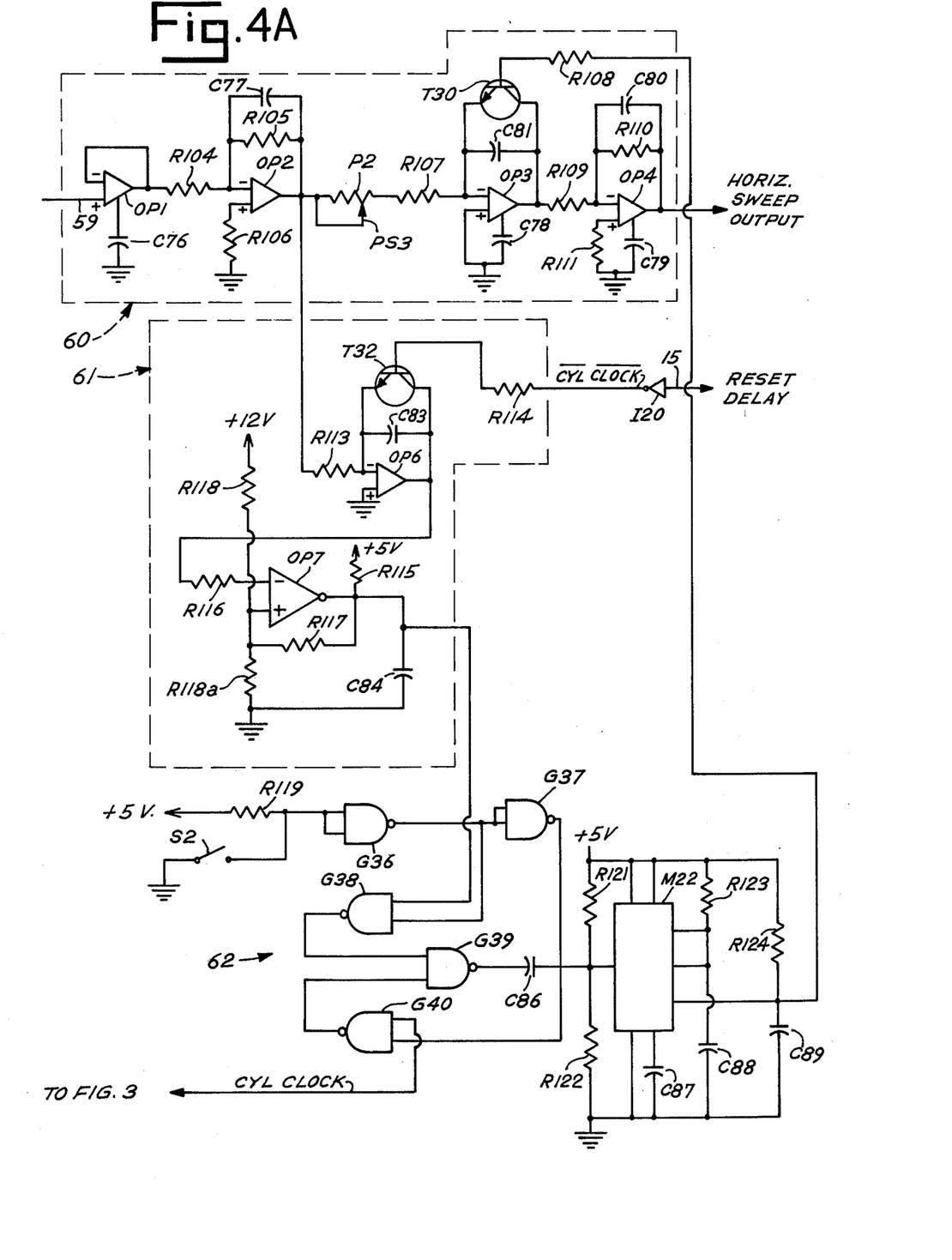
FIG. 4A is an electrical schematic diagram of a preferred form of sweep and advanced trigger circuit made in accordance with the invention.

Sweep circuit 60 is shown in more detail in FIG. 4A. The circuit includes an operational amplifier OP1 connected as a follower, an operational amplifier OP2 connected as an inverter, an operational amplifier OP3 connected as an integrater, and an operational amplifier OP4 connected as an output driver. A transistor T30 returns the ramp signal generated by operational amplifer OP3 to a low level when the transistor is switched to its conductive state.

Figure 7:
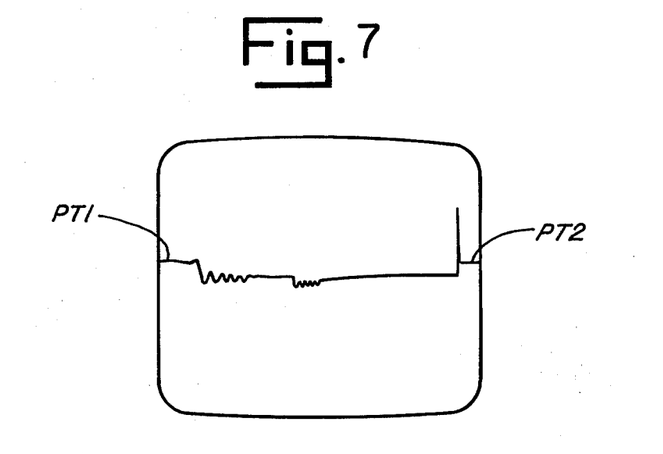
FIG. 7 illustrates a typical waveform displayed on CRT108 when switch S2 of FIG. 4A is open.

Sweep circuit 60 also includes resistors R104–R111, a potentiometer P2 which has its resistance controlled by a slider PS3, and capacitors C76–C81. The amplitude of the individual sweep ramp signal generated by operational amplifier OP3 can be adjusted by moving slider PS3. The output of operational amplifer OP3 is reset to a lower voltage once for each firing of the spark plugs in the cylinders of an engine being analyzed. As soon as OP3 is reset, it begins to generate a ramp signal which causes an electron beam of an electron gun inside CRT108 to sweep across the display face of CRT108 from point PT1 to point PT2 (FIG. 7).

The exact point in time of the engine cycle at which the ramp voltage output of OP3 commences is determined by an advance trigger circuit 61, a trigger selection circuit 62 and a pulse forming circuit 63;

Advance trigger circuit 61 comprises an operational amplifier OP6 connected as an integrator and an operational amplifier OP7 connected as a comparator. Each time a CYL CLOCK pulse is received from an inverter I20 over conductor 15 (FIG. 3), a transistor T32 is switched to its conductive state, thereby returning the ramp voltage produced by OP6 to a lower value.

Circuit 61 also comprises resistors R113-R118a and capacitors C83, C84.

Trigger selection circuit 62 comprises NAND gates G36–G40, a resistor R119 and a switch S2. When switch S2 is in the open position as shown, sweep circuit 60 is reset by the CYL CLOCK pulse in the manner described hereafter. When switch S2 is closed, sweep circuit 60 is reset by an advanced trigger pulse generated by circuit 61.

Pulse forming circuit 63 comprises a one shot multivibrator M22, as well as resistors R121–R124 and capacitors C86–C89.

If switch S2 is in the position shown, NAND gate G38 prevents the transmission of pulses from operational amplifier OP7 to NAND gate G39. Likewise, NAND gate G40 enables CYL CLOCK pulses from conductor 15 to be transmitted through NAND gate G39 to pulse forming circuit 63. In response to each CYL CLOCK pulse, circuit 63 generates a positive pulse which switches transistor T30 to its conductive state, thereby returning the ramp voltage generated by operational amplifier OP3 to a lower value. As shown in FIG. 6, the CYL CLOCK pulse commences at the same time that a secondary voltage peak, such as SP1, occurs (FIG. 6). As a result, the voltage peak of the secondary signal is normally displayed at the extreme right-hand portion of a display screen within CRT108 (FIG. 7). In some types of ignition analysis, this form of display is disadvantageous because it separates the peak secondary signal from the following portions of the waveform.

Figure 8:
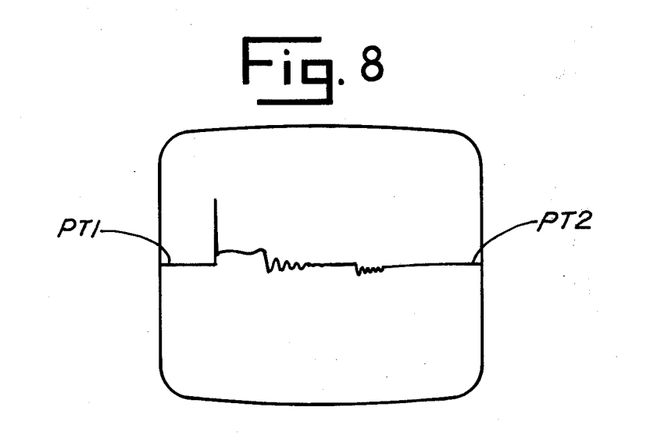
FIG. 8 illustrates a typical waveform displayed on CRT108 when switch S2 of FIG. 4A is closed.

In order to enable the complete viewing of the secondary signal peaks, such as SP1, SP2, switch S2 (FIG. 4A) is closed. When switch S2 is closed, NAND gate G40 prevents CYL CLOCK pulses from being transmitted to gate G39, and NAND gate G38 is enabled to receive a pulse from operational amplifier 7. At time T0, as secondary peak SP1 occurs, a CYL CLOCK pulse occurs, ocurs, and transistor T32 is switched to its conductive state, thereby commencing the generation of the advanced trigger ramp shown in FIG. 6. After the advanced trigger ramp has reached a voltage VC, which is approximately three quarters of the peak value of the advanced trigger ramp voltage waveform, operational amplifier OP7 generates an output pulse which is transmitted through gate G38 and gate G39 to pulse forming circuit 63. In response to the pulse from operational amplifier OP7, circuit 63 generates a positive pulse which switches transistor T30 to its conductive state at time T1. As a result, the sweep or ramp voltage generated by operational amplifier OP3 is returned to a low voltage and starts another cycle of operation at time T1. In this mode of operation, the secondary peak voltage SP2 appears on the display face approximately one quarter of the distance from the left-hand side to the right-hand side of the face (FIG. 8). As a result, the entire peak voltage SP2, as well as the following portions of the waveform up to at least point P4, (FIG. 4) are displayed on the display face. At time T2, as secondary peak signal SP2 is generated by the engine being tested, another CYL CLOCK pulse is generated and the advance trigger ramp is returned to a low voltage by the conduction of transistor T32.

Figure 5:
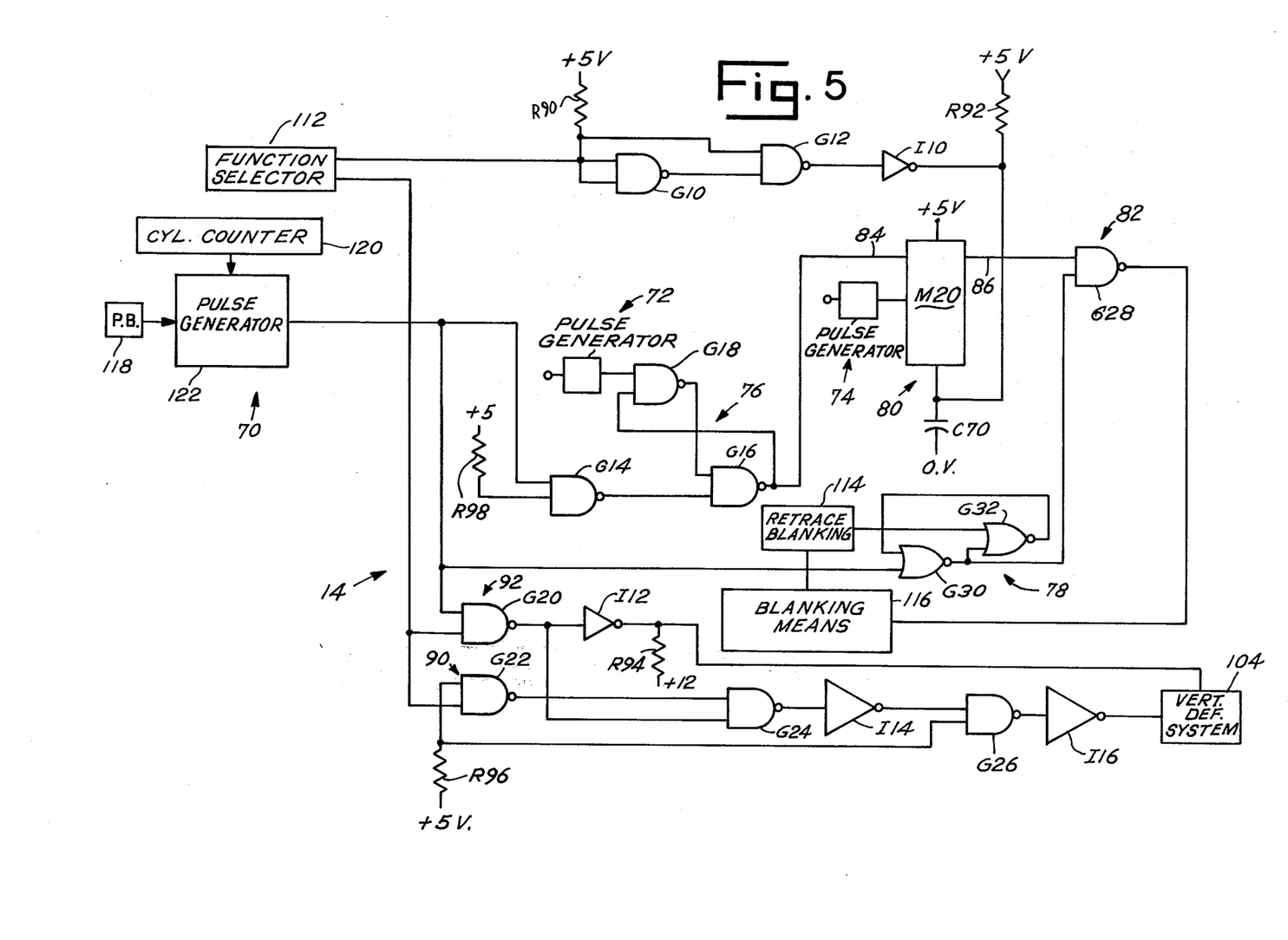
FIG. 5 is an electrical schematic diagram of the loupe circuit shown in FIG. 2.

Referring now to FIG. 5, the operational mode of the preferred embodiment is selectively chosen by means of a conventional function selector 112. Function selector 112 provides a low or ground potential, in each mode, to the interconnected circuitry.

Conventional means 114 generates a retrace blanking pulse and conventional blanking means 116 is responsive to the blanking pulse. The blanking means 116 is included in the cathode ray tube 108 (FIG. 2). A blanking pulse is issued after each complete horizontal trace.

The preferred embodiment also includes a "loupe" feature, available in the parade mode of operation. This loupe feature enables one cylinder waveform to be selected and isolated for analysis. The selected cylinder waveform is shifted upwards from the zero line and extended to full horizontal scale. Selection is achieved by a series of push buttons 118, schematically shown in FIG. 5.

In this preferred embodiment, push buttons 118 operate in conjunction with a cylinder counter 120 and a pulse generator 122 to provide a selected cylinder pulse. Push buttons, a cylinder counter and a pulse generator of the appropriate type are shown in U.S. Pat. No. 3,788,129 (Trussell—Jan. 29, 1974). The Trussel patent also shows how these devices are connected to a typical engine. The ignition waveform corresponding to the selected cylinder is displaced from the parade.

The loupe circuit 14 is shown in detail in FIG. 5. The loupe circuit 14 is a novel device for enabling certain portions of an ignition signal to be enlarged and removed from its normal display location on a CRT tube for isolated viewing. By using the sophisticated techniques described herein, the loup feature can be used in the raster and superimposed modes of operation, as well as the parade mode.

In raster, the selected cylinder waveform is delected from the "staircase" display and shifted or displaced to a dwell line (not shown), below the zero line on the cathode ray tube 108. The dwell line includes a dwell angle scale. The cathode ray tube 108, shown in FIG. 1, is appropriately modified to include the dwell line.

In the superimposed mode, the selected cylinder waveform alone is displayed. Multiple waveforms can be displayed by actuation of multiple push bottons 118. The unselected cylinder waveforms are blanked by blanking means 116 in response to the loupe circuit 14. If no button 118 is actuated, all cylinder waveforms are displayed.

The loupe circuit 14 includes first means 70 for generating at least one SELECTED CYLINDER pulse, second means 72 for generating a RESET pulse, third means 74 for generating a TRANSFER pulse, first latch means 76, second latch means 78, voltage transfer means 80 and gate means 82, primarily operable in the superimposed mode. The loupe circuit 14 also includes first and second gate means 90, 92 primarily operable in the raster mode.

More particularly, the loupe circuit 14 includes resistors R90–R98, capacitor C70, gates G10–G32, inverters I10–I16 and a D-type flip-flop M20, inter-connected as shown. The push buttons 118, cylinder counter 120 and pulse generator 122 cooperatively define first means 70. The SELECTED CYLINDER, RESET and TRANSFER pulses are shown in FIG. 6. The selected cylinder is the second cylinder shown therein. The RESET and TRANSFER pulses are generated in response to a single ignition waveform, as are the SAMPLE and DUMP pulses.

The voltage transfer means 80 includes an input terminal 84, output terminal 86 and transfer control terminal 88. As shown, the transfer control terminal 88 is connected to the third means 74 for receipt of a TRANSFER pulse. In response thereto, the voltage transfer means 80 shifts or transfers the voltage at the input terminal 84 to the output terminal 86. The output terminal 86 is thereafter maintained until another TRANSFER pulse is received. The voltage transfer means 80 is enabled by the function selector 112.

The first latch means 76 interposes the first and second means 70, 72 and the voltage transfer means 80. As such, the first latch means 76, including a pair of NAND gates, is responsive to the SELECTED CYLINDER pulse and RESET pulse and produces an input voltage to the voltage transfer means 80. The first latch means 76 is operable in a first and second state to produce an input voltage having a first and second input level, respectively.

The output terminal 86 of the voltage transfer means 80 is connected to an input of the gate means 82, a NAND gate. The other input is connected to the first means 70 through the second latch means 78, including a pair of NOR gates G30, G32. As shown, the gate G32 is connected to the retrace blanking means 114 for receipt of the retrace blanking pulse.

The second latch means 78 is operable in a set and reset state to produce a control voltage. The control voltage has a first and second control level in the set and reset states, respectively.

Without actuation of a cylinder selector button 118, the input voltage to the voltage transfer means 80 is low. The output produced by the gate means 82 is high and no blanking occurs, except retrace blanking. The output of the second latch means 78 is reset high by each retrace blanking pulse.

When a SELECTED CYLINDER pulse is generated, the input voltage, produced by the first latch means 76, responsively goes high and is transferred to the output terminal 86 and gate means 82 with the first subsequent TRANSFER pulse. The SELECTED CYLINDER pulse also triggers the second latch means 78, such that a lower output is developed thereby throughout the duration of the SELECTED CYLINDER pulse. The gate means 82 responsively produces a high output and the selected cylinder waveform is displayed on the cathode ray tube 108. Subsequently, the second latch means 78 is reset by the retrace blanking pulse, such that the unselected cylinder waveforms are blanked, i.e., the output of the gate means 82 is low.

The output terminal 86 of the voltage transfer means 80 remains high until generation of SELECTED CYLINDER pulses ceases. This results from the timing of the RESET and TRANSFER pulses; and RESET pulse sequentially follows the TRANSFER pulse. More particularly, the input voltage produced by the first latch means 76 is set high by the SELECTED CYLINDER pulse and transferred by the TRANSFER pulse, prior to reset. Only after cessation of the SELECTED CYLINDER pulses will the input voltage be low at the time of a TRANSFER pulse.

In the raster mode, the first gate means 90 produces a CANCEL pulse in response to the SELECTED CYLINDER pulse. The first gate means 90 and vertical deflection system 104 are interconnected, such that the "staricase" voltage pattern in the raster mode is cancelled for the selected cylinder. Responsive to the SELECTED CYLINDER pulse, the second gate means 90 produces a DISPLACING pulse received by the vertical deflection system 104 to shift the selected waveform to the dwell line.

A single preferred embodiment of the present invention has been disclosed and described herein. It is to be understood, however, that changes and modifications can be made without departing from the true scope and spirit of the present inention, as defined in the following claims.

What is claimed is:

1. In a device for displaying an ignition signal of an engine having a variable speed, said device including sweep means for varying sweep time, an improved means for correlating said variable speed and said sweep time comprising, in combination:
    generator means for generating a sample pulse and a dump pulse in response to said ignition signal, said dump pulse sequentially following said sample pulse;

first voltage storage means;
integrator means for producing a ramp voltage;
first controllably conductive means for discharging said integrator means in response to said dump pulse;
first switch means for selectively interconnecting said first voltage storage means and said integrator means in response to said sample pulse, whereby said first voltage storage means is charged to a sample sweep voltage substantially inversely proportional to said variable speed;
reciprocal means for producing an output voltage substantially proportional to said variable engine speed in response to said sample sweep voltage; and,
means for interconnecting said reciprocal means and said sweep means.

2. An improved means as claimed in claim 1 wherein said first voltage storage means is a capacitor.

3. An improved means as claimed in claim 1 wherein said first controllably conductive means includes a transistor having a control terminal interconnected to said generator means for receipt of said dump pulse.

4. In display means for displaying an ignition waveform in a superimposed fashion, said display means having retrace means for generating a retrace blanking pulse and blanking means responsive thereto, an improvement comprising, in combination:
first means for generating at least one selected cylinder pulse corresponding to a predetermined ignition waveform;
second means for generating a reset pulse in response to said ignition waveform;
third means for generating a transfer pulse in response to said ignition waveform, said reset pulse sequentially following said transfer pulse;
first latch means for producing an input voltage in response to said first and second means, said first latch means having a first and second operable state, said input voltage having a first input level and a second input level in said first and second operable states, respectively;
voltage transfer means, having an input terminal, output terminal and transfer control terminal, said input terminal being interconnected to said first latch means to receive said input voltage, for transferring said input voltage to said output terminal in response to said transfer pulse, said transfer control terminal being interconnected with said third means to receive said transfer pulse;
second latch means for producing a control voltage in response to said retrace means and said first means, said second latch means having a set and reset state, said control voltage having a first control level and a second control level in said set and reset states, respectively;
gate means for producing a blanking signal in response to said second latch means and said voltage transfer means; and
means for interconnecting said gate means and said blanking means, whereby said predetermined ignition waveform alone is displayed by said display means.

5. An improvement as claimed in claim 1 wherein said gate means includes a NAND gate.

6. An improvement as claimed in claim 1 wherein said latch means switches to said first operable state in response to said selected cylinder pulse.

7. An improvement as claimed in claim 6 wherein said latch means switches to said second operable state in response to said reset pulse.

8. An improvement as claimed in claim 7 wherein said second latch means switches to said set state in response to said selected cylinder pulse.

9. An improvement as claimed in claim 8 wherein said second latch means switches to said reset state in response to said retrace blanking pulse.

10. An improvement as claimed in claim 4 wherein said latch means includes a pair of NAND gates.

11. In display means for displaying an ignition waveform in a raster mode, said display means having vertical deflection means and a dwell line, said vertical deflection system producing a staircase voltage pattern, an improvement comprising, in combination:
first means for generating a selected cylinder pulse corresponding to a predetermined ignition waveform;
first gate means for producing a cancel pulse in response to said selected cylinder pulse;
means for interconnecting said first gate means and said vertical deflection to cancel said staircase voltage pattern during said selected cylinder pulse;
second gate means for producing a displacing pulse in response to said selected cylinder pulse; and
means for interconnecting said second gate means and said vertical deflection system to display said predetermined ignition waveform along said dwell line.

12. In a device for displaying a cyclical engine ignition signal having reoccurring peaks, said ignition signal being displayed along a path on a face of the device from a first point to a second point in response to a variable sweep voltage, improved means for adjusting the time at which the display of the ignition signal commences at the first point comprising:
generator means for generating a clock pulse in response to each said reoccurring peak;
first integrator means for producing the variable sweep voltage;
first controllably conductive means for discharging said first integrator means in response to a pulse;
trigger means responsive to the clock pulses for generating a trigger pulse within a predetermined time period after the receipt of each said clock pulse; and
means for transmitting the trigger pulses to the first controllably conductive means, whereby the reoccurring peaks are displayed between the first and second points of the display face.

13. Improved means, as claimed in claim 12, wherein the trigger means comprises:
second integrator means for producing a ramp voltage which varies between first and second predetermined voltages;
second controllaby conductive means for discharging said second integrator means in response to each said clock pulse, whereby the integrator means is reset to the first predetermined voltage; and
comparator means for generating a trigger pulse each time the ramp voltage exceeds a third predetermined voltage having a value between the second and third predetermined voltage.

14. Improved means, as claimed in claim 12, wherein the means for transmitting comprises selection means for selectively transmitting the clock pulses to the first controllably conductive means, whereby the reoccurring peaks are displayed at the second point of the display face.

* * * * *